(12) United States Patent
Chen et al.

(10) Patent No.: US 9,859,258 B2
(45) Date of Patent: Jan. 2, 2018

(54) SEMICONDUCTOR DEVICE AND METHOD OF MANUFACTURE

(71) Applicant: Taiwan Semiconductor Manufacturing Company, Ltd., Hsin-Chu (TW)

(72) Inventors: Wei-Yu Chen, Hsin-Bei (TW); Tien-Chung Yang, Hsin-Chu (TW); An-Jhih Su, Bade (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/157,220

(22) Filed: May 17, 2016

(65) Prior Publication Data

US 2017/0338207 A1 Nov. 23, 2017

(51) Int. Cl.

| | |
|---|---|
| *H01L 29/40* | (2006.01) |
| *H01L 25/07* | (2006.01) |
| *H01L 25/065* | (2006.01) |
| *H01L 23/00* | (2006.01) |
| *H01L 23/522* | (2006.01) |
| *H01L 23/31* | (2006.01) |
| *H01L 25/00* | (2006.01) |
| *H01L 21/768* | (2006.01) |
| *H01L 21/56* | (2006.01) |
| *H01L 49/02* | (2006.01) |

(52) U.S. Cl.
CPC .......... *H01L 25/071* (2013.01); *H01L 21/565* (2013.01); *H01L 21/76843* (2013.01); *H01L 21/76877* (2013.01); *H01L 23/3128* (2013.01); *H01L 23/5226* (2013.01); *H01L 24/06* (2013.01); *H01L 24/49* (2013.01); *H01L 25/0652* (2013.01); *H01L 25/50* (2013.01); *H01L 28/40* (2013.01); *H01L 2224/02372* (2013.01); *H01L 2224/02373* (2013.01); *H01L 2224/48091* (2013.01); *H01L 2225/0651* (2013.01); *H01L 2225/06517* (2013.01); *H01L 2225/06548* (2013.01); *H01L 2225/06586* (2013.01)

(58) Field of Classification Search
CPC ... H01L 25/071; H01L 25/50; H01L 25/0652; H01L 24/06; H01L 23/5226; H01L 23/3128
USPC .................................................. 257/173, 774
See application file for complete search history.

(56) References Cited

U.S. PATENT DOCUMENTS

| | | |
|---|---|---|
| 7,564,115 B2 | 7/2009 | Chen et al. |
| 7,633,165 B2 | 12/2009 | Hsu et al. |

(Continued)

*Primary Examiner* — Long K Tran
(74) *Attorney, Agent, or Firm* — Slater Matsil, LLP

(57) ABSTRACT

A semiconductor device and a method of manufacture are provided. In particular, a semiconductor device includes a first set of through vias between and connecting a top package and a redistribution layer (RDL), the first set of through vias in physical contact with a molding compound and separated from a die. The semiconductor device also includes a first interconnect structure between and connecting the top package and the RDL, the first interconnect structure separated from the die and from the first set of through vias by the molding compound. The first interconnect structure includes a second set of through vias and at least one integrated passive device.

20 Claims, 12 Drawing Sheets

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2007/0296062 A1* | 12/2007 | Chan .................... H05K 1/0266 257/621 |
| 2014/0001645 A1 | 1/2014 | Lin et al. |
| 2014/0167269 A1* | 6/2014 | Lu ........................... H01L 25/04 257/762 |
| 2014/0225258 A1 | 8/2014 | Chiu et al. |
| 2014/0252572 A1 | 9/2014 | Hou et al. |
| 2015/0287697 A1 | 10/2015 | Tsai et al. |
| 2015/0348872 A1 | 12/2015 | Kuo et al. |

\* cited by examiner

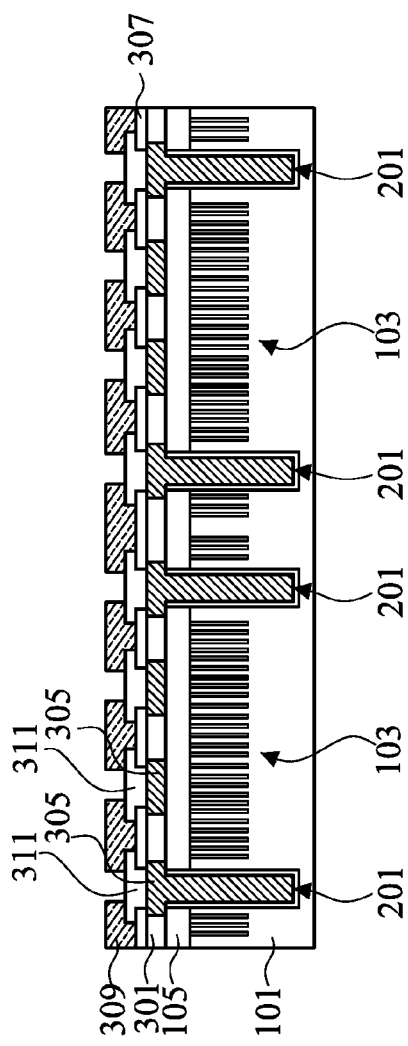
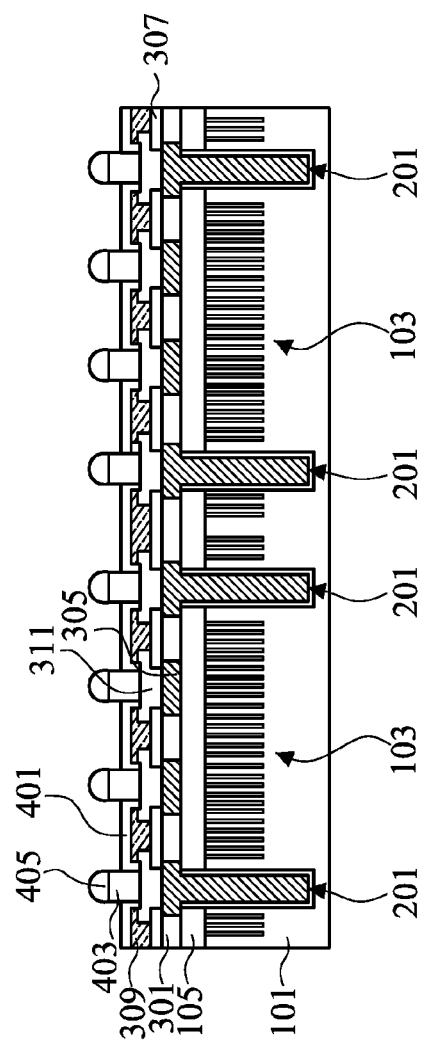

SEMICONDUCTOR DEVICE AND METHOD OF MANUFACTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates formation of metallization layers and passivation layers in accordance with some embodiments.

FIG. 4 illustrates formation of external connections in accordance with some embodiments.

DETAILED DESCRIPTION

Figure 1:
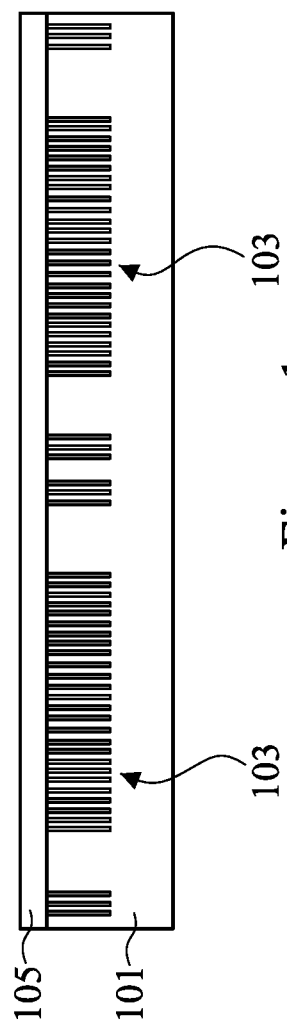
FIG. 1 illustrates formation of integrated passive devices in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-7 illustrate the formation of an embodiment of a first interconnect structure 711 and a second interconnect structure 713. In some embodiments, the first interconnect structure 711 and a second interconnect structure 713 may be an embedded dual side IPD (eDS-IPD). With reference now to FIG. 1, there is shown a first substrate 101, integrated passive devices (IPDs) 103, and a first metallization layer 105. The first substrate 101 may comprise bulk silicon, doped or undoped, a silicon-on-insulator (SOI) substrate, silicon dioxide (SiO$_2$) or other insulating material, or another material. The IPDs 103 may comprise a wide variety of passive devices such as capacitors, resistors, inductors and the like. In the embodiments shown in FIG. 1-7, the IPDs 103 are shown as deep-trench capacitors, though in other embodiments the IPDs 103 may comprise one or more other types of passive devices as described above.

The IPDs 103 may be formed using any suitable methods either within or else on the first substrate 101. For example, a deep-trench capacitor may be formed by first forming trenches into the first substrate 101. The trenches may be formed by any suitable photolithographic mask and etching process. For example, a photoresist may be formed and patterned over the first substrate 101, and one or more etching processes (e.g., a dry etch process) may be utilized to remove those portions of the first substrate 101 where the deep-trench capacitors are desired. A first capacitor electrode may be formed by forming a first conductive electrode material into a trench, such as through a deposition process or another process. The first conductive electrode material may be a conductive material such as doped silicon, polysilicon, copper, tungsten, an aluminum or copper alloy, or another conductive material. A dielectric layer may be formed over the first conductive electrode material within the trench. The dielectric layer may comprise high-K dielectric materials, an oxide, a nitride, or the like, or combinations or multiple layers thereof, and be formed using any suitable deposition process, such as a CVD process. A second conductive electrode material may be formed over the dielectric layer in the trench to form a second capacitor electrode, such as through a deposition process or another process. The second conductive electrode material may be a conductive material such as doped silicon, polysilicon, copper, tungsten, an aluminum or copper alloy, or another conductive material. As one of ordinary skill in the art will recognize, the above described process for forming deep-trench capacitors is merely one method of forming the deep-trench capacitors, and other methods are also fully intended to be included within the scope of the embodiments.

Returning to FIG. 1, the first metallization layer 105 is formed over the first substrate 101 and is designed to connect the various IPDs 103. In an embodiment the first metallization layer 105 comprises one or more layers of dielectric and conductive material and may be formed through any suitable process (such as a suitable photolithographic mask and etching process, deposition, damascene, dual damascene, etc.). The conductive material in the first metallization layer 105 may comprise a conductive material such as copper, although other conductive materials, such as tungsten, aluminum or copper alloy, or the like may be used.

Figure 2:
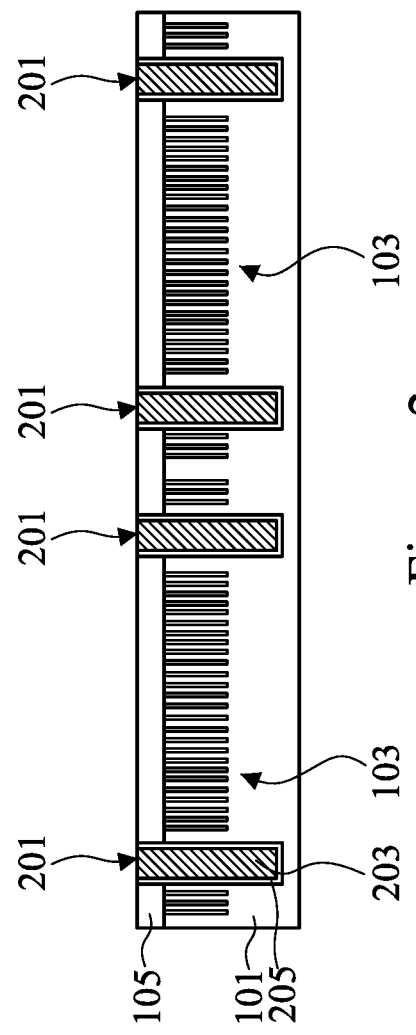
FIG. 2 illustrates formation of through substrate vias in accordance with some embodiments.

FIG. 2 illustrates the formation of through-substrate-vias (TSVs) 201 in the first substrate 101. The TSVs 201 may be formed, for example, by etching openings into the first metallization layer 105 and the first substrate 101 and then depositing a conductive material 203 into the openings. Openings into the first metallization layer 105 and the first substrate 101 may be formed using a suitable photolithographic mask and etching process. For example, a photoresist may be formed and patterned over the first metallization layer 105, and one or more etching processes (e.g., a wet etch process or a dry etch process) are utilized to remove those portions of the first metallization layer 105 and the first substrate 101 where the TSVs 201 are desired.

Once the openings for the TSVs 201 have been formed, the openings for the TSVs 201 may be filled with, e.g., a barrier layer 205 and the conductive material 203. The barrier layer 205 may comprise a conductive material such as titanium nitride, although other materials, such as tantalum nitride, titanium, a dielectric, or the like may be utilized. The barrier layer 205 may be formed using a CVD process, such as PECVD. However, other alternative processes, such as sputtering or metal organic chemical vapor deposition (MOCVD), may be used. The barrier layer 205 may be formed so as to contour to the underlying shape of the opening for the TSVs 201.

The conductive material 203 may comprise one or more conductive materials, such as copper, tungsten, other conductive metals, or the like. The conductive material 203 may be formed, for example, by depositing a seed layer (not separately illustrated) and using electroplating, electroless plating, or the like to deposit conductive material onto the seed layer, filling and overfilling the openings for the TSVs 201. Once the openings for the TSVs 201 have been filled, excess barrier layer 205 and excess conductive material 203 outside of the openings for the TSVs 201 may be removed through a grinding process such as chemical mechanical polishing (CMP), although any suitable removal process may be used. In an embodiment, the TSVs 201 have a width of between about 5 µm and about 60 µm, such as about 10 µm. As one of ordinary skill in the art will recognize, the above described process for forming the TSVs 201 is merely one method of forming the TSVs 201, and other methods are also fully intended to be included within the scope of the embodiments.

With reference now to FIG. 3, there is shown a first passivation layer 301, a second passivation layer 307, a third passivation layer 309, first metal contacts 305, and connection terminals 311. The first passivation layer 301 may be formed on the first metallization layer 105 over the TSVs 201 and the IPDs 103. The first passivation layer 301 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. In some embodiments, the first passivation layer 301 may be polybenzoxazole (PBO), although any suitable material, such as polyimide or a polyimide derivative, may be utilized. The first passivation layer 301 may be placed using, e.g., a spin-coating process to a thickness of between about 5 µm and about 25 µm, such as about 7 µm, although any suitable method and thickness may be used. In other embodiments, the first passivation layer 301 may be formed through a process such as chemical vapor deposition (CVD).

The first metal contacts 305 are located in the first passivation layer 301. The first metal contacts 305 connect to the TSVs 201 and the IPDs 103 through the first metallization layer 105. The first metal contacts 305 may comprise a conductive material such as copper, although other conductive materials, such as tungsten, aluminum or copper alloy, or the like may be used. Openings into the first passivation layer 301 may be formed using a suitable photolithographic mask and etching process. The first metal contacts 305 may be formed in the openings in the first passivation layer 301 using a suitable process such as deposition, damascene, dual damascene, or another process. In some cases, components such as the first metal contacts 305, TSVs 201, IPDs 103, and other components described herein may be connected to other components without directly contacting the other components. For example, a first component may be electrically or communicatively connected to a second component through a third component without directly contacting the second component.

In other embodiments, the first metal contacts 305 may be formed using a deposition process, such as sputtering, to form a layer of material (e.g., aluminum or another conductive material) and portions of the layer of material may then be removed through a suitable process (such as photolithographic masking and etching) to form the first metal contacts 305. However, any other suitable process may be utilized to form the first metal contacts 305. One the first metal contacts 305 are formed, the first passivation layer 301 may be formed over the first metal contacts 305.

The second passivation layer 307 may be formed over the first passivation layer 301 and the first metal contacts 305 in order to protect the first passivation layer 301 and the first metal contacts 305 from physical and environmental damage during subsequent processing and environments. The second passivation layer 307 may be formed of similar materials and through similar processes as the first passivation layer 301, although the second passivation layer 307 may be formed of different materials than the first passivation layer 301. In some embodiments, the second passivation layer 307 is planarized, e.g., using a chemical mechanical polish (CMP) process.

Once the second passivation layer 307 has been formed over the first passivation layer 301 and the first metal contacts 305, openings may be formed through the second passivation layer 307 in order to expose a portion of the first metal contacts 305 for further connections. The openings may be formed through a suitable masking and removal process, such as a suitable photolithographic masking and etching process. The disclosed patterning process discussed, however, is merely intended as a representative process, and any other suitable patterning process may be utilized to expose a portion of the first metal contacts 305.

Once the first metal contacts 305 have been exposed through the second passivation layer 307, the connection terminals 311 may be formed in electrical contact with the first metal contacts 305 through the second passivation layer 307. In some embodiments, the connection terminals 311 comprise one or more bonding pads, such as an Al pad, an AlCu pad, or pads of other suitable materials. In some embodiments, the connection terminals 311 further comprise underbump metallization (UBMs). The UBMs may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs are fully intended to be included within the scope of the current application.

The connection terminals 311 may be created by forming each sub-layer of the connection terminals 311 over the second passivation layer 307 and along the interior of the openings through the second passivation layer 307. The forming of each sub-layer may be performed using a plating process, such as electrochemical plating, although other processes of formation, such as sputtering, evaporation, or PECVD process, may be used depending upon the desired materials.

The third passivation layer 309 may be formed over the first passivation layer 301, the second passivation layer 307 and the connection terminals 311 in order to protect the first passivation layer 301, the second passivation layer 307, and the connection terminals 311 from physical and environmental damage during subsequent processing and environments. The third passivation layer 309 may be formed of similar materials and through similar processes as the first passivation layer 301 and the second passivation layer 307, although the third passivation layer 309 may be formed of different materials than the first passivation layer 301 and the second passivation layer 307.

Once the third passivation layer 309 has been formed over the first passivation layer 301 and second passivation layer 307 and the connection terminals 311, openings may be formed through third passivation layer 309 in order to expose a portion of the connection terminals 311 for further connections. The openings may be formed through a suitable masking and removal process, such as a suitable photolithographic masking and etching process. The disclosed patterning process discussed, however, is merely intended as a representative process, and any other suitable patterning process may be utilized to expose a portion of the connection terminals 311.

With reference now to FIG. 4, there is shown a protective coating 401, first external connections 403, and solder balls 405. The protective coating 401 may be formed on the third passivation layer 309 and the connection terminals 311. The protective coating 401 may be formed by coating on the third passivation layer 309 and the connection terminals 311 with an insulating material, such as polyimide, polybenzoxazole (PBO), or epoxy. The protective coating 401 may be formed by any suitable method, such as spraying a polyimide solution, immersing into a polyimide solution, spin-coating, or another method. In other embodiments, the protective coating 401 is not a polyimide but is a material such as comprises the first passivation layer 301, the second passivation layer 307, and the third passivation layer 309.

In an embodiment the first external connections 403 may be conductive pillars and may be formed by initially forming a photoresist (not shown) over the protective coating 401. The photoresist may be patterned to expose portions of the protective coating 401 through which the first external connections 403 will extend. Once patterned, the photoresist may then be used as a mask to remove the desired portions of the protective coating 401, forming openings exposing those portions of the underlying connection terminals 311 to which the first external connections 403 will make contact.

The first external connections 403 may be formed within the openings of both the protective coating 401 and the photoresist to provide electrical connection to the connection terminals 311. In an embodiment the first external connections 403 may be, e.g., copper pillars or copper posts. However, the embodiments are not limited to these, and may be solder bumps, copper bumps, or comprise one or more conductive materials, such as copper, tungsten, other conductive metals, or the like. Other suitable first external connections 403 may be made to provide electrical connection. All such external contacts are fully intended to be included within the scope of the embodiments.

The first external connections 403 may be formed, for example, by deposition, electroplating, electroless plating, or the like. Once the first external connections 403 have been formed using the photoresist, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the first external connections 403 such that the first external connections 403 protrude past the surface of the protective coating 401.

In an embodiment, optional solder balls 405 may be placed on the first external connections 403 and may comprise a eutectic material such as solder, although any suitable materials may alternatively be used. The solder balls 405 may be formed by initially forming a layer of tin through any suitable method such as evaporation, electroplating, printing, solder transfer, and then performing a reflow is preferably performed in order to shape the material into the desired bump shape. In another embodiment, the solder balls 405 may be formed using a ball drop method, such as a direct ball drop process.

At this stage, a circuit probe test may be performed in order to check for defective structures. In an embodiment of the circuit probe test one or more probes (not illustrated) are electrically connected to the solder balls 405 or the first external connections 403 and signals are sent into the first external connections 403 and into, e.g., the IPDs 103. If there are no significant defects, the probes will receive a predetermined output from the first external connections 403, and defective structures and Known Good Die (KGD) can be identified. Defective structures and KGD can be identified prior to further processing in order to make the overall process more efficient. For example, only KGD may be used for further processing as described below with reference to FIGS. 7-15.

Figure 5:
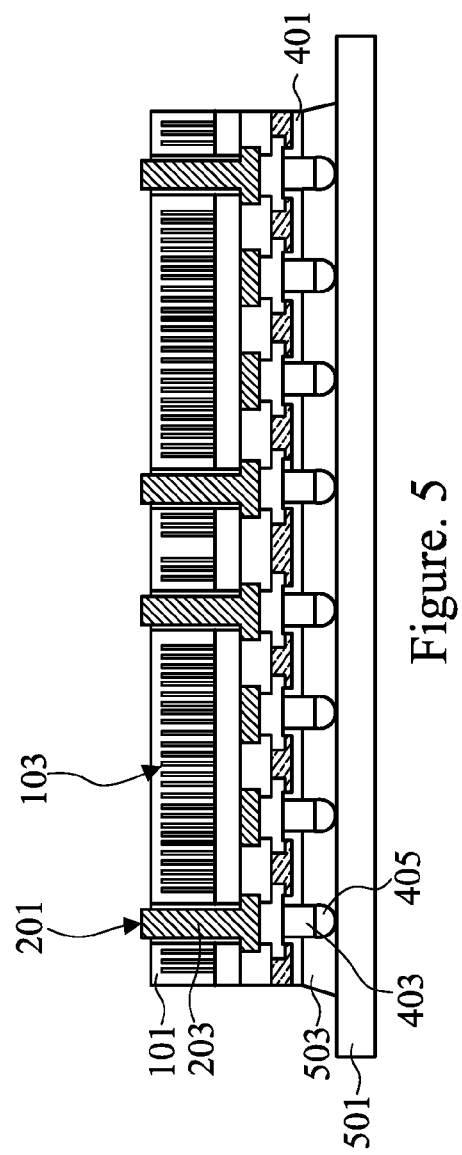
FIG. 5 illustrates substrate thinning in accordance with some embodiments.

With reference now to FIG. 5, there is shown a carrier substrate 501 and a first adhesive layer 503. The carrier substrate 501 comprises, for example, silicon based materials, such as glass or silicon oxide, or other materials, such as aluminum oxide, combinations of any of these materials, or the like. The carrier substrate 501 is planar in order to accommodate an attachment of semiconductor devices such as those illustrated and discussed with respect to FIGS. 1-4.

The first adhesive layer 503 is placed on the carrier substrate 501 in order to assist in the adherence of overlying structures (e.g., the protective coating 401, the first external connections 403, the solder balls 405). In an embodiment the first adhesive layer 503 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The first adhesive layer 503 may be placed onto the carrier substrate 501 in a semi-liquid or gel form, which is readily deformable under pressure.

FIG. 5 also illustrates a thinning of the first substrate 101 in order to expose the TSVs 201 for further processing. The thinning may be performed, e.g., using a mechanical grinding or chemical mechanical polishing (CMP) process whereby chemical etchants and abrasives are utilized to react and grind away the first substrate 101 until the conductive material 203 of the TSVs 201 has been exposed. In this manner, the TSVs 201 may be formed to have a first thickness of between about 50 μm and about 200 μm, such as about 100 μm. In an embodiment, the TSVs 201 have a cross-sectional thickness:width aspect ratio of between about 3:1 and about 10:1, such as about 5:1.

While the CMP process described above is presented as one illustrative embodiment, it is not intended to be limiting to the embodiments. Any other suitable removal process may alternatively be used to thin the first substrate 101. For example, a series of chemical etches may be utilized. This process and any other suitable process may alternatively be utilized to thin the first substrate 101, and all such processes are fully intended to be included within the scope of the embodiments. Optionally, after the first substrate 101 has been thinned, the TSVs 201 may be recessed within the first substrate 101. In an embodiment the TSVs 201 may be recessed using, e.g., an etching process that utilizes an etchant that is selective to the material of the TSVs 201 (e.g., selective to copper).

Figure 6:
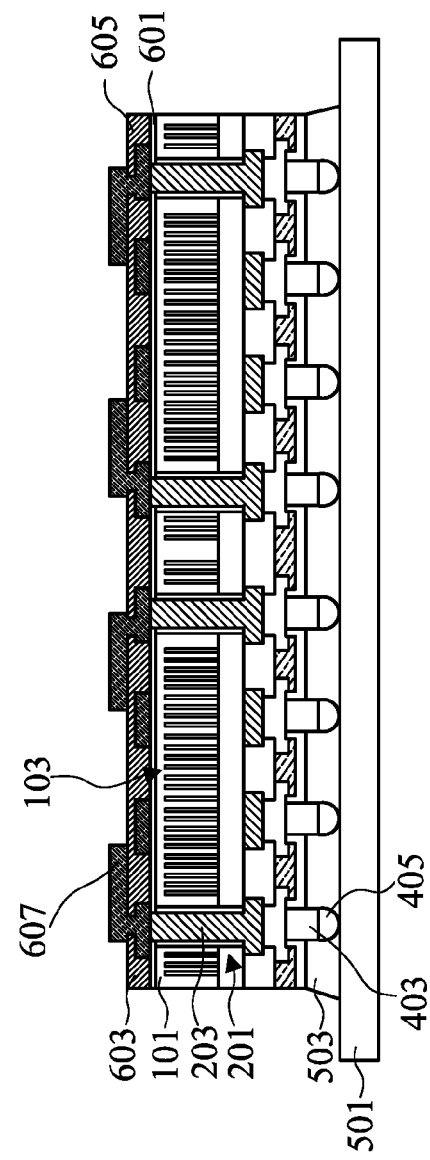
FIG. 6 illustrates formation of a redistribution layer in accordance with some embodiments.

With reference now to FIG. 6, there is shown a fourth passivation layer 601, a first redistribution layer (RDL) 603, a fifth passivation layer 605, and second metal contacts 607. The first redistribution layer 603 and the second metal contacts 607 may be formed in order to interconnect the TSVs 201 and an external semiconductor device (an example described below with reference to FIGS. 8 to 15). In an embodiment, the fourth passivation layer 601 is formed over the first substrate 101 in a process and with materials similar to the first passivation layer 301, the second passivation layer 307, and the third passivation layer 309. Alternatively, the fourth passivation layer 601 may be formed differently than the first passivation layer 301, the second passivation layer 307, and the third passivation layer 309. In an embodiment the fourth passivation layer 601 is thinned to expose the conductive material 203 of the TSVs 201. The thinning may be performed, e.g., using a mechanical grinding or CMP process.

In an embodiment the first redistribution layer 603 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 603 is desired to be located.

Once the photoresist has been formed and patterned, a conductive material, such as copper, may be formed on the seed layer through a deposition process such as plating. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 603.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

In an embodiment, a fifth passivation layer 605 is formed over the first redistribution layer 603 in a process and with materials similar to the first passivation layer 301, the second passivation layer 307, the third passivation layer 309, and the fourth passivation layer 601. Alternatively, the fifth passivation layer 605 may be formed differently than the first passivation layer 301, the second passivation layer 307, the third passivation layer 309, and the fourth passivation layer 601. In an embodiment the fifth passivation layer 605 is thinned, e.g., using a mechanical grinding or CMP process.

After the first redistribution layer 603 has been formed, openings may be made through into the first redistribution layer 603 by removing portions of the first redistribution layer 603 to expose at least a portion of the underlying conductive material. The openings may be formed using a suitable photolithographic mask and etching process, although any suitable process to expose portions of the first redistribution layer 603 may alternatively be used.

The second metal contacts 607 may be formed on the first redistribution layer 603 to form electrical connections to the first redistribution layer 603. The second metal contacts 607 may comprise aluminum, but other materials, such as copper, may alternatively be used. The second metal contacts 607 may be formed using a deposition process, such as sputtering, to form a layer of conductive material and portions of the layer of material may then be removed through a suitable process (such as photolithographic masking and etching) to form the second metal contacts 607. However, any other suitable process may be utilized to form the second metal contacts 607.

Figure 7:
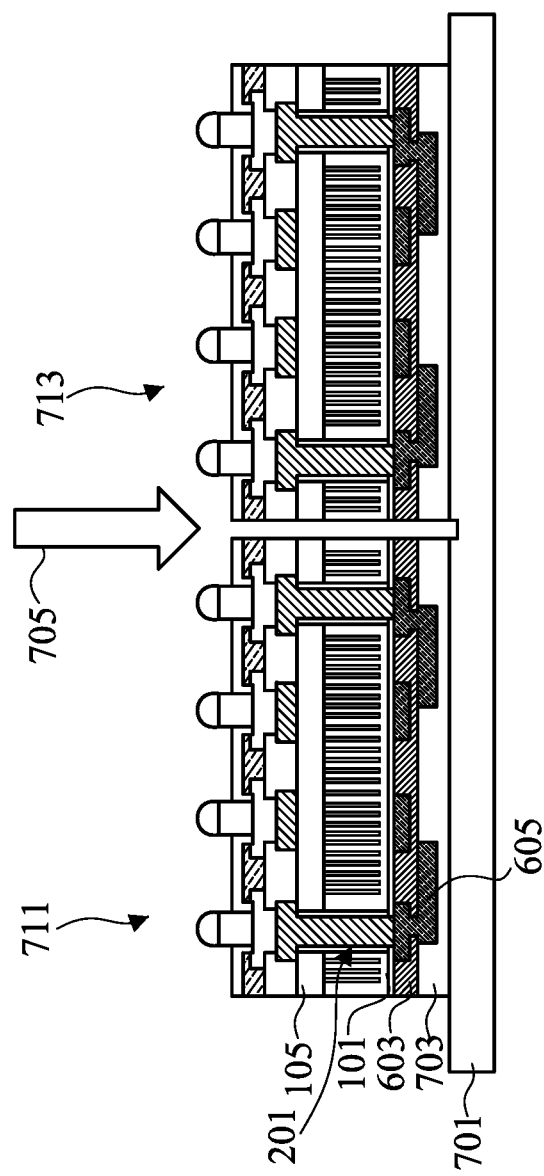
FIG. 7 illustrates a singulation process in accordance with some embodiments.

With reference now to FIG. 7, there is shown a frame 701 and a second adhesive layer 703. The second adhesive layer 703 is used to attach the first redistribution layer 603 and the second metal contacts 607 to the frame 701 for a singulation process. The frame 701 comprises, for example, silicon based materials, such as glass or silicon oxide, or other materials, such as aluminum oxide, metal, ceramic, polymer, combinations of any of these materials, or the like. In an embodiment, the second adhesive layer 703 comprises a die attach film (DAF) such as an epoxy resin, a phenol resin, acrylic rubber, silica filler, or a combination thereof, and is applied using a lamination technique. However, any other suitable alternative material and method of formation may alternatively be utilized.

FIG. 7 also illustrates a singulation 705 of a first interconnect structure 711 and a second interconnect structure 713. In an embodiment the singulation 705 may be performed by using a saw blade to slice through the second adhesive layer 703 and other layers described above with respect to FIGS. 1-6 (e.g., the first substrate 101, the first metallization layer 105, etc.), thereby separating one interconnect structure from another.

However, as one of ordinary skill in the art will recognize, utilizing a saw blade to singulate the first interconnect structure 711 and the second interconnect structure 713 is merely one illustrative embodiment and is not intended to be limiting. Alternative methods for singulating the first interconnect structure 711 and the second interconnect structure 713, such as utilizing one or more etches, may alternatively be utilized. These methods and any other suitable methods may alternatively be utilized to singulate the first interconnect structure 711 and the second interconnect structure 713.

Figure 8:
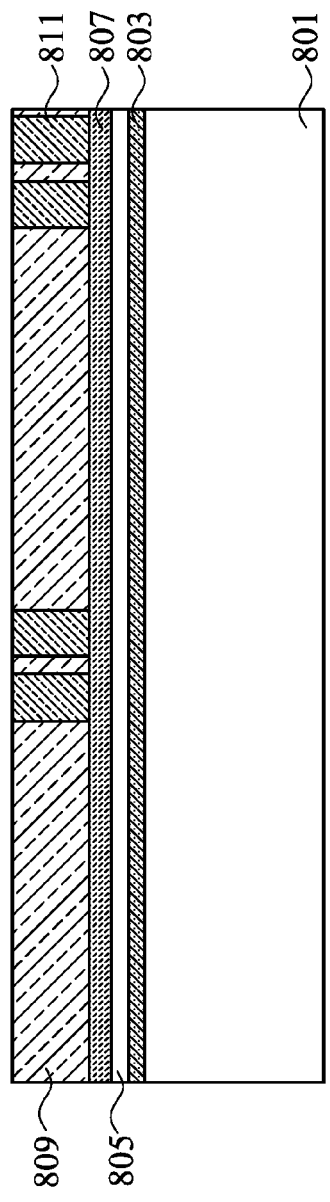
FIG. 8 illustrates formation of through vias, in accordance with some embodiments.

In some embodiments, the first interconnect structure 711 and the second interconnect structure 713 may be incorporated in an integrated fan out package-on-package (InFO-POP), discussed below with respect to FIGS. 8-16. With reference now to FIG. 8, there is shown a carrier substrate 801 with a third adhesive layer 803, a polymer layer 805, and a first seed layer 807 over the carrier substrate 801. The carrier substrate 801 comprises, for example, silicon based materials, such as glass or silicon oxide, or other materials, such as aluminum oxide, combinations of any of these materials, or the like. The carrier substrate 801 is planar in order to accommodate an attachment of semiconductor devices such as the first interconnect structure 711, the second interconnect structure 713 and a first semiconductor device 901 and a second semiconductor device 1001 (not illustrated in FIG. 9 but illustrated and discussed below with respect to FIGS. 10-15).

The third adhesive layer 803 is placed on the carrier substrate 801 in order to assist in the adherence of overlying structures (e.g., the polymer layer 805). In an embodiment the third adhesive layer 803 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The third adhesive layer 803 may be placed onto the carrier substrate 801 in a semi-liquid or gel form, which is readily deformable under pressure.

The polymer layer 805 is placed over the third adhesive layer 803 and is utilized in order to provide protection to, e.g., the first semiconductor device 901 and the second semiconductor device 1001 once the first semiconductor device 901 and the second semiconductor device 1001 have been attached. In an embodiment the polymer layer 805 may be polybenzoxazole (PBO), although any suitable material, such as polyimide or a polyimide derivative, Solder Resistance (SR), or Ajinomoto build-up film (ABF) may alternatively be utilized. The polymer layer 805 may be placed using, e.g., a spin-coating process to a thickness of between about 2 μm and about 15 μm, such as about 5 μm, although any suitable method and thickness may alternatively be used.

The first seed layer 807 is formed over the polymer layer 805. In an embodiment the first seed layer 807 is a thin layer of a conductive material that aids in the formation of a thicker layer during subsequent processing steps. The first seed layer 807 may comprise a layer of titanium about 1,000 Å thick followed by a layer of copper about 5,000 Å thick. The first seed layer 807 may be created using processes such as sputtering, evaporation, or PECVD processes, depending upon the desired materials. The first seed layer 807 may be formed to have a thickness of between about 0.3 μm and about 1 μm, such as about 0.5 μm.

FIG. 8 also illustrates a placement and patterning of a photoresist 809 over the first seed layer 807. In an embodiment the photoresist 809 may be placed on the first seed layer 807 using, e.g., a spin coating technique to a height of between about 50 μm and about 250 μm, such as about 120 μm. Once in place, the photoresist 809 may then be patterned by exposing the photoresist 809 to a patterned energy source (e.g., a patterned light source) so as to induce a chemical reaction, thereby inducing a physical change in those portions of the photoresist 809 exposed to the patterned light source. A developer is then applied to the exposed photoresist 809 to take advantage of the physical changes and selectively remove either the exposed portion of the photoresist 809 or the unexposed portion of the photoresist 809, depending upon the desired pattern.

In an embodiment the pattern formed into the photoresist 809 is a pattern for vias 811. The vias 811 are formed in such a placement as to be located on different sides of subsequently attached devices such as the first semiconductor device 901 and the second semiconductor device 1001. However, any suitable arrangement for the pattern of vias 811, such as by being located such that the first semiconductor device 901 and the second semiconductor device 1001 are placed on opposing sides of the vias 811, may alternatively be utilized.

In an embodiment the vias 811 are formed within the photoresist 809. In an embodiment the vias 811 comprise one or more conductive materials, such as copper, tungsten, other conductive metals, or the like, and may be formed, for example, by electroplating, electroless plating, or the like. In an embodiment, an electroplating process is used wherein the first seed layer 807 and the photoresist 809 are submerged or immersed in an electroplating solution. The first seed layer 807 surface is electrically connected to the negative side of an external DC power supply such that the first seed layer 807 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 807, acquires the dissolved atoms, thereby plating the exposed conductive areas of the first seed layer 807 within the opening of the photoresist 809.

Once the vias 811 have been formed using the photoresist 809 and the first seed layer 807, the photoresist 809 may be removed using a suitable removal process (not illustrated in FIG. 8 but seen in FIG. 10 below). In an embodiment, a plasma ashing process may be used to remove the photoresist 809, whereby the temperature of the photoresist 809 may be increased until the photoresist 809 experiences a thermal decomposition and may be removed. However, any other suitable process, such as a wet strip, may alternatively be utilized. The removal of the photoresist 809 may expose the underlying portions of the first seed layer 807.

Once exposed a removal of the exposed portions of the first seed layer 807 may be performed (not illustrated in FIG. 8 but seen in FIG. 10 below). In an embodiment the exposed portions of the first seed layer 807 (e.g., those portions that are not covered by the vias 811) may be removed by, for example, a wet or dry etching process. For example, in a dry etching process reactants may be directed towards the first seed layer 807 using the vias 811 as masks. In another embodiment, etchants may be sprayed or otherwise put into contact with the first seed layer 807 in order to remove the exposed portions of the first seed layer 807. After the exposed portion of the first seed layer 807 has been etched away, a portion of the polymer layer 805 is exposed between the vias 811.

Figure 9:
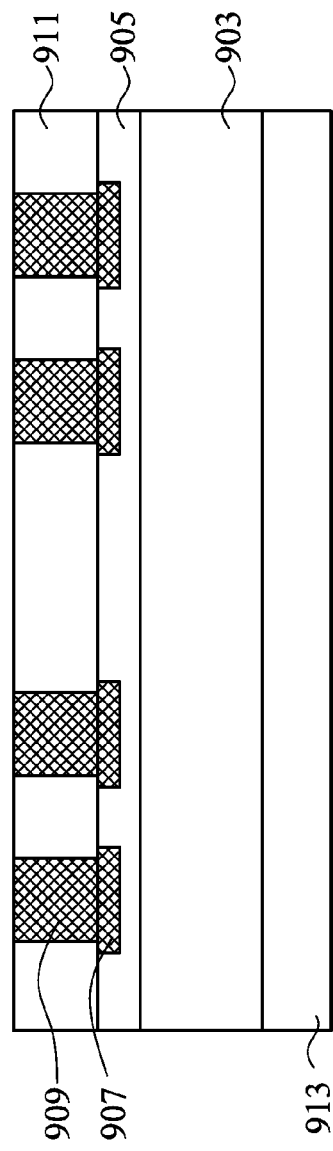
FIG. 9 illustrates embodiments of a first semiconductor device, in accordance with some embodiments.

FIG. 9 illustrates a first semiconductor device 901 that will be attached to the polymer layer 805 within the vias 811 (not illustrated in FIG. 9 but illustrated and described below with respect to FIG. 10). In an embodiment the first semiconductor device 901 comprises a third substrate 903, first active devices (not individually illustrated), second metallization layers 905, first contact pads 907, a sixth passivation layer 911, and second external connections 909. The third substrate 903 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 901. The first active devices may be formed using any suitable methods either within or else on the third substrate 903.

The second metallization layers 905 are formed over the third substrate 903 and the first active devices and are designed to connect the various active devices to form functional circuitry. In an embodiment the second metallization layers 905 are formed of alternating layers of dielectric and conductive material and may be formed through any suitable process (such as deposition, damascene, dual damascene, etc.). In an embodiment there may be four layers of metallization separated from the third substrate 903 by at least one interlayer dielectric layer (ILD), but the precise number of second metallization layers 905 is dependent upon the design of the first semiconductor device 901.

The first contact pads 907 may be formed over and in electrical contact with the second metallization layers 905. The first contact pads 907 may comprise aluminum, but other materials, such as copper, may alternatively be used. The first contact pads 907 may be formed using a deposition process, such as sputtering, to form a layer of material (not shown) and portions of the layer of material may then be removed through a suitable process (such as photolithographic masking and etching) to form the first contact pads 907. However, any other suitable process may be utilized to form the first contact pads 907. The first contact pads 907 may be formed to have a thickness of between about 0.5 μm and about 4 μm, such as about 1.45 μm.

The sixth passivation layer 911 may be formed on the third substrate 903 over the second metallization layers 905 and the first contact pads 907. The sixth passivation layer 911 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The sixth passivation layer 911 may be formed through a process such as chemical vapor deposition (CVD), although any suitable process may be utilized, and may have a thickness between about 0.5 μm and about 5 μm, such as about 9.25 KÅ.

The second external connections 909 may be formed to provide conductive regions for contact between the first contact pads 907 and, e.g., a second redistribution layer 1201 (not illustrated in FIG. 9 but illustrated and described below with respect to FIG. 12). In an embodiment the second external connections 909 may be conductive pillars and may be formed by initially forming a photoresist (not shown) over the sixth passivation layer 911 to a thickness between about 5 μm to about 20 μm, such as about 10 μm. The photoresist may be patterned to expose portions of the first passivation layers through which the conductive pillars will extend. Once patterned, the photoresist may then be used as a mask to remove the desired portions of the sixth passivation layer 911, thereby exposing those portions of the underlying first contact pads 907 to which the second external connections 909 will make contact.

The second external connections 909 may be formed within the openings of both the sixth passivation layer 911 and the photoresist. The second external connections 909 may be formed from a conductive material such as copper, although other conductive materials such as nickel, gold, or metal alloy, combinations of these, or the like may also be used. Additionally, the second external connections 909 may be formed using a process such as electroplating, by which an electric current is run through the conductive portions of the first contact pads 907 to which the second external connections 909 are desired to be formed, and the first contact pads 907 are immersed in a solution. The solution and the electric current deposit, e.g., copper, within the openings in order to fill and/or overfill the openings of the photoresist and the sixth passivation layer 911, thereby forming the second external connections 909. Excess conductive material and photoresist outside of the openings of the sixth passivation layer 911 may then be removed using, for example, an ashing process, a chemical mechanical polish (CMP) process, combinations of these, or the like.

However, as one of ordinary skill in the art will recognize, the above described process to form the second external connections 909 is merely one such description, and is not meant to limit the embodiments to this exact process. Rather, the described process is intended to be merely illustrative, as any suitable process for forming the second external connections 909 may alternatively be utilized. All suitable processes are fully intended to be included within the scope of the present embodiments.

On an opposite side of the third substrate 903 than the second metallization layers 905, a die attach film (DAF) 913 may be formed in order to assist in the attachment of the first semiconductor device 901 to the polymer layer 805. In an embodiment the die attach film is an epoxy resin, a phenol resin, acrylic rubber, silica filler, or a combination thereof, and is applied using a lamination technique. However, any other suitable alternative material and method of formation may alternatively be utilized.

Figure 10:
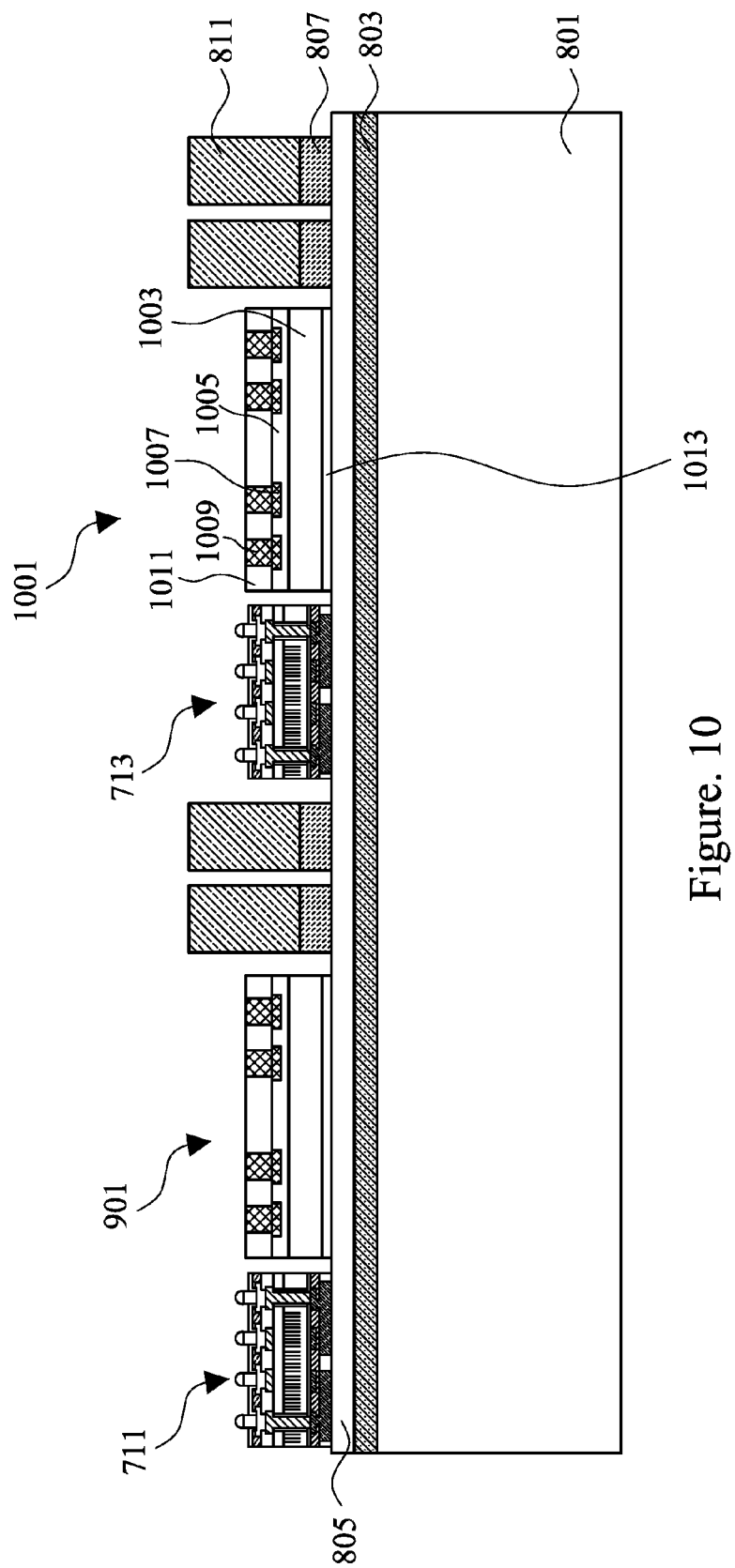
FIG. 10 illustrates a placement of the first semiconductor device and a first interconnect structure between the through vias, in accordance with some embodiments.

FIG. 10 illustrates a placement of the first interconnect structure 711, the second interconnect structure 713, the first semiconductor device 901, and the second semiconductor device 1001 onto the polymer layer 805. In an embodiment the second semiconductor device 1001 may comprise a fourth substrate 1003, second active devices (not individually illustrated), third metallization layers 1005, second contact pads 1007, a seventh passivation layer 1011, a second die attach film (DAF) 1013, and third external connections 1009. In an embodiment the fourth substrate 1003, second active devices (not individually illustrated), third metallization layers 1005, second contact pads 1007, a seventh passivation layer 1011, and third external connections 1009 may be similar to the third substrate 903, the first active devices, the second metallization layers 905, the first contact pads 907, the sixth passivation layer 911, and the second external connections 909, although they may also be different.

In an embodiment the first interconnect structure 711, the second interconnect structure 713, the first semiconductor device 901, and the second semiconductor device 1001 may be placed onto the polymer layer 805 using, e.g., a pick-and-place process. However, any other alternative method of placing the first interconnect structure 711, the second interconnect structure 713, the first semiconductor device 901, and the second semiconductor device 1001 may be used.

Figure 11:
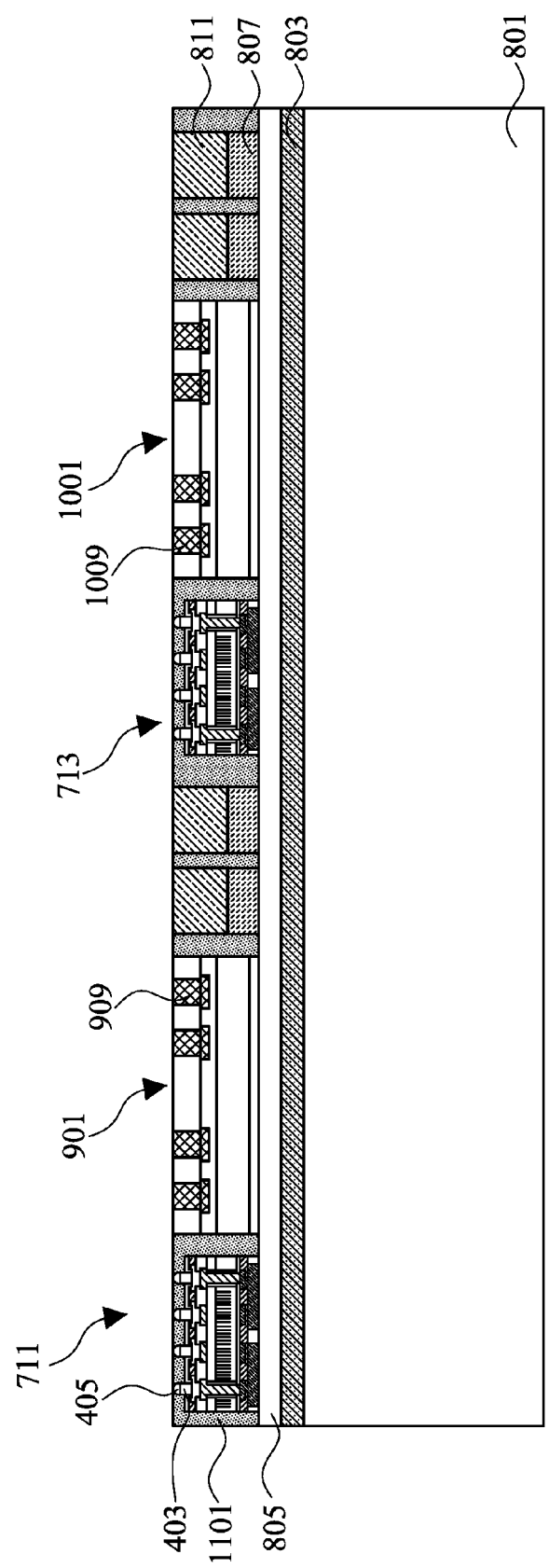
FIG. 11 illustrates an encapsulation of the first semiconductor device, first interconnect structure, and through vias, in accordance with some embodiments.

FIG. 11 illustrates an encapsulation of the vias 811, the first semiconductor device 901 and the second semiconductor device 1001. The encapsulation may be performed in a molding device (not individually illustrated in FIG. 11), which may comprise a top molding portion and a bottom molding portion separable from the top molding portion. When the top molding portion is lowered to be adjacent to the bottom molding portion, a molding cavity may be formed for the carrier substrate 801, the vias 811, the first interconnect structure 711, the second interconnect structure 713, the first semiconductor device 901, and the second semiconductor device 1001.

During the encapsulation process the top molding portion may be placed adjacent to the bottom molding portion, thereby enclosing the carrier substrate 801, the vias 811, the first semiconductor device 901, and the second semiconductor device 1001 within the molding cavity. Once enclosed, the top molding portion and the bottom molding portion may form an airtight seal in order to control the influx and outflux of gasses from the molding cavity. Once sealed, an encapsulant 1101 may be placed within the molding cavity. The encapsulant 1101 may be a molding compound resin such as polyimide, PPS, PEEK, PES, a heat resistant crystal resin, combinations of these, or the like. The encapsulant 1101 may be placed within the molding cavity prior to the alignment of the top molding portion and the bottom molding portion, or else may be injected into the molding cavity through an injection port.

The encapsulant 1101 may be placed into the molding cavity such that the encapsulant 1101 encapsulates the carrier substrate 801, the vias 811, the first interconnect structure 711, the second interconnect structure 713, the first semiconductor device 901, and the second semiconductor device 1001. For example, the encapsulant 1101 may surround the vias 811, directly contacting conductive material of the vias 811 and/or oxidized conductive material present on the surface of the vias 811. Once the encapsulant 1101 has been placed into the molding cavity, the encapsulant 1101 may be cured in order to harden the encapsulant 1101 for optimum protection. While the exact curing process is dependent at least in part on the particular material chosen for the encapsulant 1101, in an embodiment in which molding compound is chosen as the encapsulant 1101, the curing could occur through a process such as heating the encapsulant 1101 to between about 100° C. and about 130° C., such as about 125° C. for about 60 sec to about 3000 sec, such as about 600 sec. Additionally, initiators and/or catalysts may be included within the encapsulant 1101 to better control the curing process.

However, as one having ordinary skill in the art will recognize, the curing process described above is merely an exemplary process and is not meant to limit the current embodiments. Other curing processes, such as irradiation or even allowing the encapsulant 1101 to harden at ambient temperature, may alternatively be used. Any suitable curing process may be used, and all such processes are fully intended to be included within the scope of the embodiments discussed herein.

FIG. 11 also illustrates a thinning of the encapsulant 1101 in order to expose the vias 811, the first interconnect structure 711, the second interconnect structure 713, the first semiconductor device 901, and the second semiconductor device 1001 for further processing. The thinning may be performed, e.g., using a mechanical grinding or chemical mechanical polishing (CMP) process whereby chemical etchants and abrasives are utilized to react and grind away the encapsulant 1101, the first semiconductor device 901 and the second semiconductor device 1001 until the vias 811, the second external connections 909 (on the first semiconductor device 901), the third external connections 1009 (on the second semiconductor device 1001), and the (optional) solder balls 405 or the first external connections 403 (on the first interconnect structure 711 and the second interconnect structure 713) have been exposed. As such, the first semiconductor device 901, the second semiconductor device 1001, the first interconnect structure 711, the second interconnect structure 713, and the vias 811 may have a planar surface that is also planar with the encapsulant 1101.

However, while the CMP process described above is presented as one illustrative embodiment, it is not intended to be limiting to the embodiments. Any other suitable removal process may alternatively be used to thin the encapsulant 1101, the first semiconductor device 901, and the second semiconductor device 1001. For example, a series of chemical etches may be utilized. This process and any other suitable process may alternatively be utilized to thin the encapsulant 1101, the first semiconductor device 901, and the second semiconductor device 1001, and all such processes are fully intended to be included within the scope of the embodiments.

Figure 12:
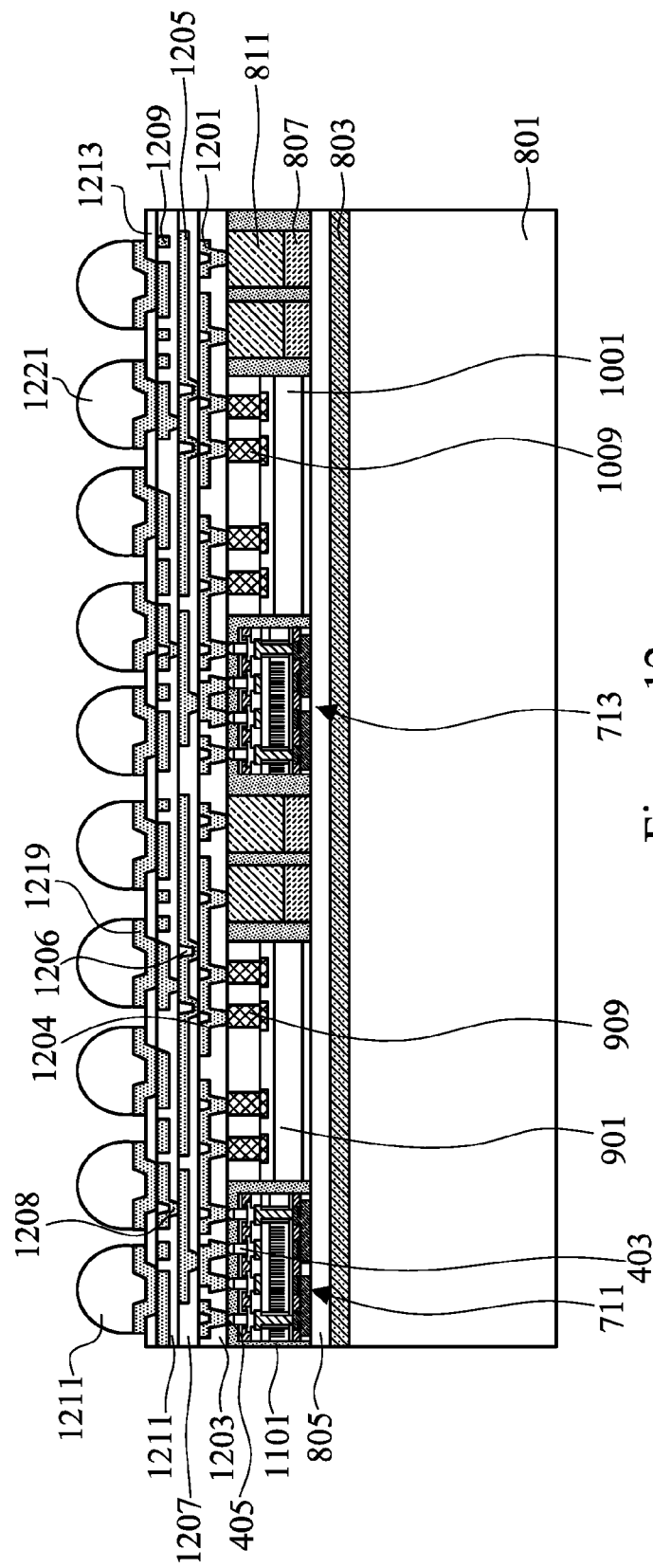
FIG. 12 illustrates formation of redistribution layers and external connections, in accordance with some embodiments.

FIG. 12 illustrates a cross-sectional view of a formation of a second redistribution layer (RDL) 1201, a third redistribution layer 1205, and a fourth redistribution layer 1209 in order to interconnect the first semiconductor device 901, the second semiconductor device 1001, the vias 811, the first interconnect structure 711, the second interconnect structure 713, and a fourth external connection 1221. FIG. 12 also illustrates a formation of an eighth passivation layer 1203 over the encapsulant 1101, the first semiconductor device 901, the second semiconductor device 1001, the vias 811, the first interconnect structure 711, and the second interconnect structure 713 in order to provide protection and isolation for the other underlying structures. In an embodiment the eighth passivation layer 1203 may be polybenzoxazole (PBO), although any suitable material, such as polyimide or a polyimide derivative, may alternatively be utilized. The eighth passivation layer 1203 may be placed using, e.g., a spin-coating process to a thickness of between about 5 µm and about 25 µm, such as about 7 µm, although any suitable method and thickness may alternatively be used.

After the eighth passivation layer 1203 has been formed, first openings 1204 (only one of which is illustrated in FIG. 12 for clarity) may be made through the eighth passivation layer 1203 by removing portions of the eighth passivation layer 1203 to expose at least a portion of the underlying second external connections 909 (on the first semiconductor device 901), the third external connections 1009 (on the second semiconductor device 1001), and the (optional) solder balls 405 or first external connections 403 (on the first interconnect structure 711 and the second interconnect structure 713). The first openings 1204 allow for contact between the second redistribution layer 1201 and the underlying structures. The first openings 1204 may be formed using a suitable photolithographic mask and etching process, although any suitable process to expose the underlying structures may also be used.

In an embodiment the second redistribution layer 1201 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the second redistribution layer 1201 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may alternatively be used to form the second redistribution layer 1201.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 12 also illustrates a formation of a ninth passivation layer 1207 over the second redistribution layer 1201 in order to provide protection and isolation for the second redistribution layer 1201 and the other underlying structures. In an embodiment the ninth passivation layer 1207 may be polybenzoxazole (PBO), although any suitable material, such as polyimide or a polyimide derivative, may alternatively be utilized. The ninth passivation layer 1207 may be placed using, e.g., a spin-coating process to a thickness of between about 5 µm and about 25 µm, such as about 7 µm, although any suitable method and thickness may alternatively be used.

After the ninth passivation layer 1207 has been formed, second openings 1206 (only one of which is illustrated in FIG. 12 for clarity) may be made through the ninth passivation layer 1207 by removing portions of the ninth passivation layer 1207 to expose at least a portion of the underlying second redistribution layer 1201. The second openings 1206 allow for contact between the second redistribution layer 1201 and a third redistribution layer 1205 (described further below). The second openings 1206 may be formed using a suitable photolithographic mask and etching process, although any suitable process to expose portions of the second redistribution layer 1201 may alternatively be used.

The third redistribution layer 1205 may be formed to provide additional routing and connectivity and in electrical connection with the second redistribution layer 1201. In an embodiment the third redistribution layer 1205 may be formed similar to the second redistribution layer 1201. For example, a seed layer may be formed, a photoresist may be placed and patterned on top of the seed layer, and conductive material may be plated into the patterned openings through the photoresist. Once formed, the photoresist may be removed, the underlying seed layer may be etched, the third redistribution layer 1205 may be covered by a tenth passivation layer 1211 (which may be similar to the ninth passivation layer 1207), and the tenth passivation layer 1211 may be patterned to form third openings 1208 (only one of which is illustrated in FIG. 12 for clarity) and expose an underlying conductive portion of the third redistribution layer 1205.

The fourth redistribution layer 1209 may be formed to provide additional routing along with electrical connection between the third redistribution layer 1205 and the fourth external connection 1221. In an embodiment the fourth redistribution layer 1209 may be formed using materials and processes similar to the second redistribution layer 1201. For example, a seed layer may be formed, a photoresist may be placed and patterned on top of the seed layer in a desired pattern for the fourth redistribution layer 1209, conductive material is plated into the patterned openings of the photoresist, the photoresist is removed, and the seed layer is etched.

Figure 13:
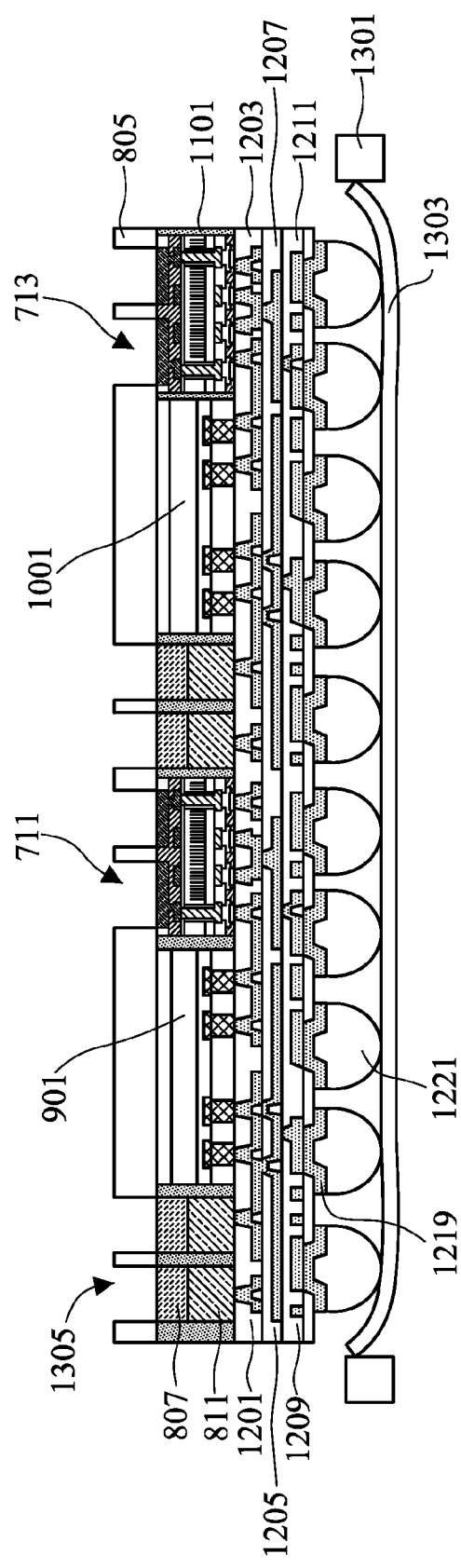
FIG. 13 illustrates a debonding of the carrier wafer in accordance with some embodiments.

Turning now to FIGS. 12 and 13, after the fourth redistribution layer 1209 has been formed, an eleventh passivation layer 1213 may be formed over the fourth redistribution layer 1209 in order to protect the fourth redistribution layer 1209 and other underlying structures. In an embodiment the eleventh passivation layer 1213, similar to the eighth passivation layer 1203, may be formed from a polymer such as PBO, or may be formed of a similar material as the eighth passivation layer 1203 (e.g., polyimide or a polyimide derivative). The eleventh passivation layer 1213 may be formed to have a thickness of between about 2 µm and about 15 µm, such as about 5 µm.

After the eleventh passivation layer 1213 has been formed, an opening may be made through the eleventh passivation layer 1213 by removing portions of the eleventh passivation layer 1213 to expose at least a portion of the underlying fourth redistribution layer 1209. The opening allows for contact between the fourth redistribution layer 1209 and the second UBMs 1219. The opening may be formed using a suitable photolithographic mask and etching process, although any suitable process to expose portions of the fourth redistribution layer 1209 may be used.

Once the fourth redistribution layer 1209 has been exposed through the eleventh passivation layer 1213, the second UBMs 1219 may be formed in electrical contact with the eleventh passivation layer 1213. The second UBMs 1219 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the second UBMs 1219. Any suitable materials or layers of material that may be used for the second UBMs 1219 are fully intended to be included within the scope of the current application.

The second UBMs 1219 may be created by forming each layer over the eleventh passivation layer 1213 and along the interior of the opening through the eleventh passivation layer 1213. The forming of each layer may be performed using a plating process, such as electrochemical plating, although other processes of formation, such as sputtering, evaporation, or PECVD process, may alternatively be used depending upon the desired materials. The second UBMs 1219 may be formed to have a thickness of between about 0.7 μm and about 10 μm, such as about 5 μm. Once the desired layers have been formed, portions of the layers may then be removed through a suitable photolithographic masking and etching process to remove the undesired material and to leave the second UBMs 1219 in a desired shape, such as a circular, octagonal, square, or rectangular shape, although any desired shape may alternatively be formed.

The fourth external connection 1221 may be utilized to provide an external connection point for electrical connection to the fourth redistribution layer 1209 and may be, for example, a contact bump, although any suitable connection may be utilized. In an embodiment in which the fourth external connection 1221 is a contact bump, the fourth external connection 1221 may comprise a material such as tin, or other suitable materials, such as silver, lead-free tin, or copper. In an embodiment in which the fourth external connection 1221 is a tin solder bump, the fourth external connection 1221 may be formed by initially forming a layer of tin through such commonly used methods such as evaporation, electroplating, printing, solder transfer, ball placement, etc., to a thickness of, e.g., about 100 μm. Once a layer of tin has been formed on the structure, a reflow may be performed in order to shape the material into the desired bump shape.

FIG. 13 illustrates a debonding of the carrier substrate 801 from the first interconnect structure 711, the second interconnect structure 713, the first semiconductor device 901, and the second semiconductor device 1001. In an embodiment the fourth external connection 1221 and, hence, the structure including the first interconnect structure 711, the second interconnect structure 713, the first semiconductor device 901, and the second semiconductor device 1001, may be attached to a ring structure 1301. The ring structure 1301 may be a metal ring intended to provide support and stability for the structure during and after the debonding process. In an embodiment the fourth external connection 1221, the first interconnect structure 711, the second interconnect structure 713, the first semiconductor device 901, and the second semiconductor device 1001 are attached to the ring structure 1301 using, e.g., a ultraviolet tape 1303, although any other suitable adhesive or attachment may alternatively be used.

Once the fourth external connection 1221 and, hence, the structure including the first interconnect structure 711, the second interconnect structure 713, the first semiconductor device 901, and the second semiconductor device 1001 are attached to the ring structure 1301, the carrier substrate 801 may be debonded from the structure including the first interconnect structure 711, the second interconnect structure 713, the first semiconductor device 901, and the second semiconductor device 1001 using, e.g., a thermal process to alter the adhesive properties of the third adhesive layer 803. In a particular embodiment an energy source such as an ultraviolet (UV) laser, a carbon dioxide ($CO_2$) laser, or an infrared (IR) laser, is utilized to irradiate and heat the third adhesive layer 803 until the third adhesive layer 803 loses at least some of its adhesive properties. Once performed, the carrier substrate 801 and the third adhesive layer 803 may be physically separated and removed from the structure comprising the fourth external connection 1221, the first interconnect structure 711, the second interconnect structure 713, the first semiconductor device 901, and the second semiconductor device 1001.

FIG. 13 additionally illustrates a patterning of the polymer layer 805 in order to expose the vias 811 (along with the associated first seed layer 807), the first interconnect structure 711, and the second interconnect structure 713. In an embodiment the polymer layer 805 may be patterned using, e.g., a laser drilling method. In such a method a protective layer, such as a light-to-heat conversion (LTHC) layer or a hogomax layer (not separately illustrated in FIG. 13) is first deposited over the polymer layer 805. Once protected, a laser is directed towards those portions of the polymer layer 805 which are desired to be removed in order to expose the underlying vias 811, the first interconnect structure 711, and the second interconnect structure 713. During the laser drilling process the drill energy may be in a range from 0.1 mJ to about 30 mJ, and a drill angle of about 0 degree (perpendicular to the polymer layer 805) to about 85 degrees to normal of the polymer layer 805. In an embodiment the patterning may be formed to form fourth openings 1305 over the vias 811 to have a width of between about 100 μm and about 300 μm, such as about 200 μm.

In another embodiment, the polymer layer 805 may be patterned by initially applying a photoresist (not individually illustrated in FIG. 13) to the polymer layer 805 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 805 are removed with, e.g., a dry etch process. However, any other suitable method for patterning the polymer layer 805 may be utilized.

Figure 14:
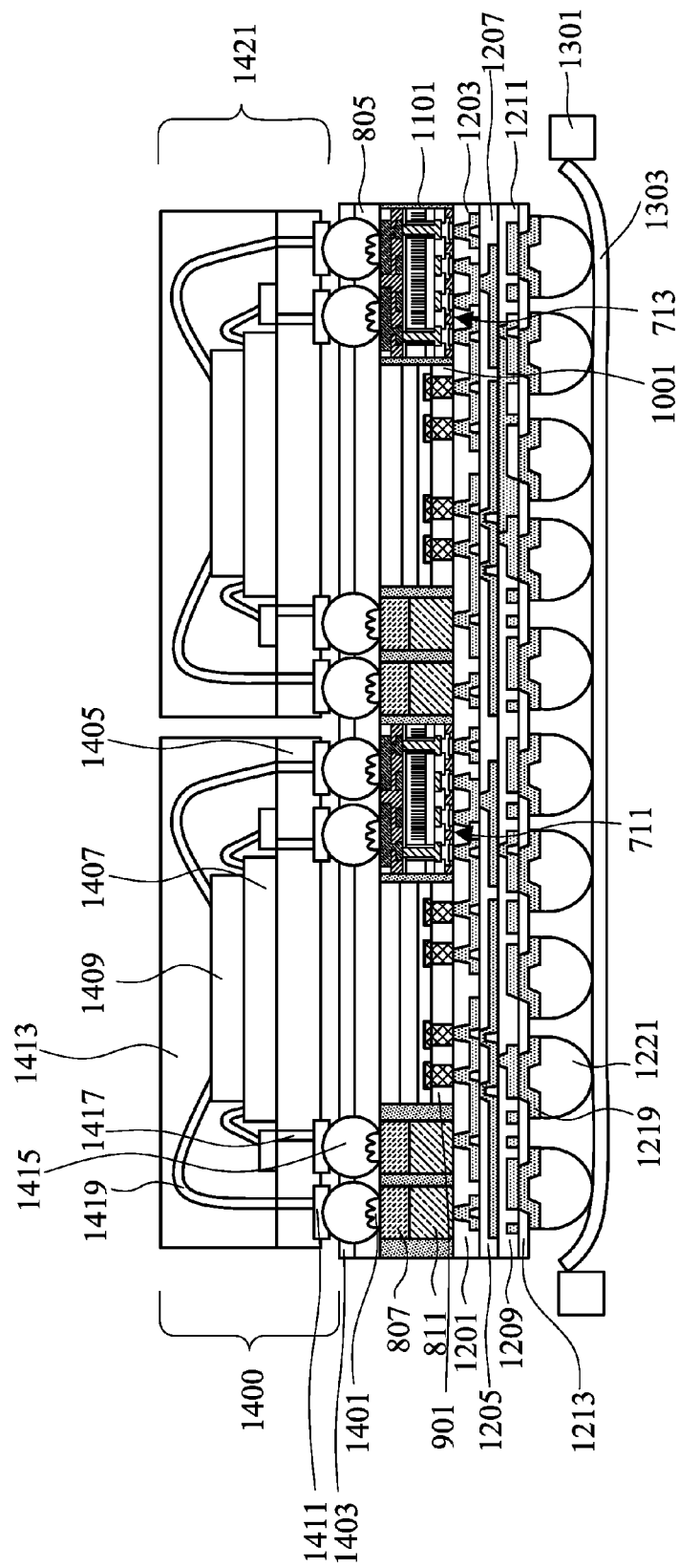
FIG. 14 illustrates a bonding of a first package and a second package in accordance with some embodiments.

FIG. 14 illustrates a placement of a backside ball pad 1401 within the fourth openings 1305 in order to protect the now exposed vias 811 and the second metal contacts 607. In an embodiment the backside ball pads 1401 may comprise a conductive material such as solder on paste or an oxygen solder protection (OSP), although any suitable material may alternatively be utilized. In an embodiment the backside ball pads 1401 may be applied using a stencil, although any suitable method of application may alternatively be utilized, and then reflowed in order to form a bump shape.

FIG. 14 also illustrates a placement and patterning of a backside protection layer 1403 over the backside ball pads 1401, effectively sealing the joint between the backside ball pads 1401 and the vias 811 from intrusion by moisture. In an embodiment the backside protection layer 1403 may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer 1403 may be applied using a process such as screen printing, lamination, spin coating, or the like, to a thickness of between about 1 μm to about 200 μm.

FIG. 14 also illustrates that, once the backside protection layer 1403 has been placed, the backside protection layer 1403 may be patterned in order to expose the backside ball pads 1401. In an embodiment the backside protection layer 1403 may be patterned using, e.g., a laser drilling method, by which a laser is directed towards those portions of the backside protection layer 1403 which are desired to be removed in order to expose the backside ball pads 1401. During the laser drilling process the drill energy may be in a range from 0.1 mJ to about 30 mJ, and a drill angle of about 0 degree (perpendicular to the backside protection layer 1403) to about 85 degrees to normal of the backside protection layer 1403. In an embodiment the exposure may form openings with a diameter of between about 30 µm and about 300 µm, such as about 150 µm.

In another embodiment, the backside protection layer 1403 may be patterned by initially applying a photoresist (not individually illustrated in FIG. 14) to the backside protection layer 1403 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the backside protection layer 1403 are removed with, e.g., a dry etch process. However, any other suitable method for patterning the backside protection layer 1403 may be utilized.

FIG. 14 also illustrates a bonding of the backside ball pads 1401 to a first package 1400. In an embodiment the first package 1400 may comprise a fifth substrate 1405, a third semiconductor device 1407, a fourth semiconductor device 1409 (bonded to the third semiconductor device 1407), third contact pads 1411, a second encapsulant 1413, and fifth external connections 1415. In an embodiment the fifth substrate 1405 may be, e.g., a packaging substrate comprising internal interconnects (e.g., through substrate vias 1417) to connect the third semiconductor device 1407 and the fourth semiconductor device 1409 to the backside ball pads 1401.

Alternatively, the fifth substrate 1405 may be an interposer used as an intermediate substrate to connect the third semiconductor device 1407 and the fourth semiconductor device 1409 to the backside ball pads 1401. In this embodiment the fifth substrate 1405 may be, e.g., a silicon substrate, doped or undoped, or an active layer of a silicon-on-insulator (SOI) substrate. However, the fifth substrate 1405 may alternatively be a glass substrate, a ceramic substrate, a polymer substrate, or any other substrate that may provide a suitable protection and/or interconnection functionality. These and any other suitable materials may alternatively be used for the fifth substrate 1405.

The third semiconductor device 1407 may be a semiconductor device designed for an intended purpose such as a memory die (e.g., a DRAM die), a logic die, a central processing unit (CPU) die, combinations of these, or the like. In an embodiment the third semiconductor device 1407 comprises integrated circuit devices, such as transistors, capacitors, inductors, resistors, first metallization layers (not shown), and the like, therein, as desired for a particular functionality. In an embodiment the third semiconductor device 1407 is designed and manufactured to work in conjunction with or concurrently with the first semiconductor device 901.

The fourth semiconductor device 1409 may be similar to the third semiconductor device 1407. For example, the fourth semiconductor device 1409 may be a semiconductor device designed for an intended purpose (e.g., a DRAM die) and comprising integrated circuit devices for a desired functionality. In an embodiment the fourth semiconductor device 1409 is designed to work in conjunction with or concurrently with the first semiconductor device 901 and/or the third semiconductor device 1407.

The fourth semiconductor device 1409 may be bonded to the third semiconductor device 1407. In an embodiment the fourth semiconductor device 1409 is only physically bonded with the third semiconductor device 1407, such as by using an adhesive. In this embodiment the fourth semiconductor device 1409 and the third semiconductor device 1407 may be electrically connected to the fifth substrate 1405 using, e.g., wire bonds 1419, although any suitable electrical bonding may be alternatively be utilized.

Alternatively, the fourth semiconductor device 1409 may be bonded to the third semiconductor device 1407 both physically and electrically. In this embodiment the fourth semiconductor device 1409 may comprise sixth external connections (not separately illustrated in FIG. 14) that connect with seventh external connections (also not separately illustrated in FIG. 14) on the third semiconductor device 1407 in order to interconnect the fourth semiconductor device 1409 with the third semiconductor device 1407.

The third contact pads 1411 may be formed on the fifth substrate 1405 to form electrical connections between the third semiconductor device 1407 and, e.g., the fifth external connections 1415. In an embodiment the third contact pads 1411 may be formed over and in electrical contact with electrical routing (such as through substrate vias 1417) within the fifth substrate 1405. The third contact pads 1411 may comprise aluminum, but other materials, such as copper, may alternatively be used. The third contact pads 1411 may be formed using a deposition process, such as sputtering, to form a layer of material (not shown) and portions of the layer of material may then be removed through a suitable process (such as photolithographic masking and etching) to form the third contact pads 1411. However, any other suitable process may be utilized to form the third contact pads 1411. The third contact pads 1411 may be formed to have a thickness of between about 0.5 µm and about 4 µm, such as about 1.45 µm.

The second encapsulant 1413 may be used to encapsulate and protect the third semiconductor device 1407, the fourth semiconductor device 1409, and the fifth substrate 1405. In an embodiment the second encapsulant 1413 may be a molding compound and may be placed using a molding device (not illustrated in FIG. 14). For example, the fifth substrate 1405, the third semiconductor device 1407, and the fourth semiconductor device 1409 may be placed within a cavity of the molding device, and the cavity may be hermetically sealed. The second encapsulant 1413 may be placed within the cavity either before the cavity is hermetically sealed or else may be injected into the cavity through an injection port. In an embodiment the second encapsulant 1413 may be a molding compound resin such as polyimide, PPS, PEEK, PES, a heat resistant crystal resin, combinations of these, or the like.

Once the second encapsulant 1413 has been placed into the cavity such that the second encapsulant 1413 encapsulates the region around the fifth substrate 1405, the third semiconductor device 1407, and the fourth semiconductor device 1409, the second encapsulant 1413 may be cured in order to harden the second encapsulant 1413 for optimum protection. While the exact curing process is dependent at least in part on the particular material chosen for the second encapsulant 1413, in an embodiment in which molding compound is chosen as the second encapsulant 1413, the curing could occur through a process such as heating the second encapsulant 1413 to between about 100° C. and about 130° C., such as about 125° C. for about 60 sec to about 3000 sec, such as about 600 sec. Additionally, initiators and/or catalysts may be included within the second encapsulant 1413 to better control the curing process.

However, as one having ordinary skill in the art will recognize, the curing process described above is merely an exemplary process and is not meant to limit the current embodiments. Other curing processes, such as irradiation or even allowing the second encapsulant 1413 to harden at ambient temperature, may alternatively be used. Any suitable curing process may be used, and all such processes are fully intended to be included within the scope of the embodiments discussed herein.

In an embodiment the fifth external connections 1415 may be formed to provide an external connection between the fifth substrate 1405 and, e.g., the backside ball pads 1401. The fifth external connections 1415 may be contact bumps such as microbumps or controlled collapse chip connection (C4) bumps and may comprise a material such as tin, or other suitable materials, such as silver or copper. In an embodiment in which the fifth external connections 1415 are tin solder bumps, the fifth external connections 1415 may be formed by initially forming a layer of tin through any suitable method such as evaporation, electroplating, printing, solder transfer, ball placement, etc., to a thickness of, e.g., about 100 µm. Once a layer of tin has been formed on the structure, a reflow is performed in order to shape the material into the desired bump shape.

Once the fifth external connections 1415 have been formed, the fifth external connections 1415 are aligned with and placed into physical contact with the backside ball pads 1401, and a bonding is performed. For example, in an embodiment in which the fifth external connections 1415 are solder bumps, the bonding process may comprise a reflow process whereby the temperature of the fifth external connections 1415 is raised to a point where the fifth external connections 1415 will liquefy and flow, thereby bonding the first package 1400 to the backside ball pads 1401 once the fifth external connections 1415 resolidifies.

FIG. 14 additionally illustrates the bonding of a second package 1421 to the backside ball pads 1401. In an embodiment the second package 1421 may be similar to the first package 1400, and may be bonded to the backside ball pads 1401 utilizing similar processes. However, the second package 1421 may also be different from the first package 1400. As FIG. 14 shows, the first package 1400 may be electrically connected to the second redistribution layer 1201 through the vias 811 and the TSVs 201 in the first interconnect structure 711. Similarly, the second package 1421 may be electrically connected to the second redistribution layer 1201 through the vias 811 and the TSVs 201 in the second interconnect structure 713.

Figure 15:
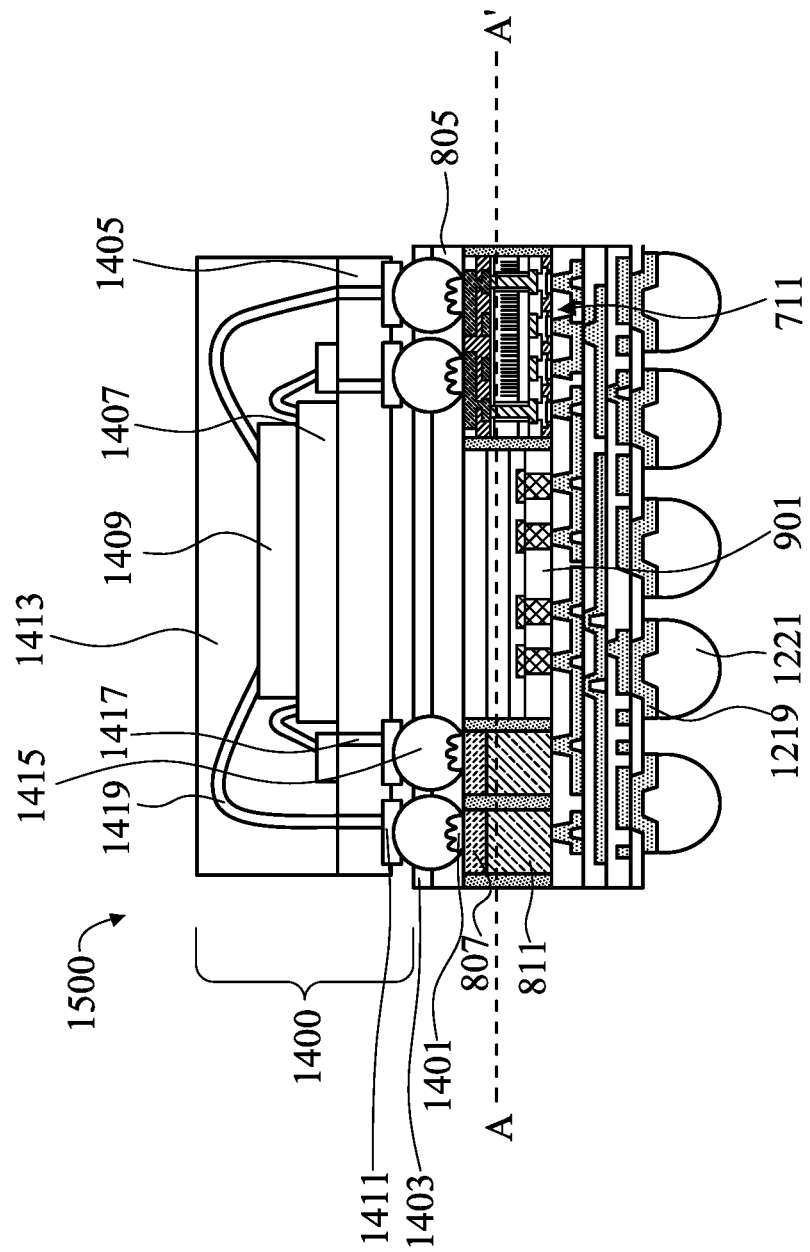
FIG. 15 illustrates an InFO-POP structure in accordance with some embodiments.

FIG. 15 illustrates a debonding of the fourth external connection 1221 from the ring structure 1301 and a singulation of the structure to form an integrated fan out package-on-package (InFO-POP) structure 1500. In an embodiment the fourth external connection 1221 may be debonded from the ring structure 1301 by initially bonding the first package 1400 and the second package 1421 to a second ring structure using, e.g., a second ultraviolet tape. Once bonded, the ultraviolet tape 1303 may be irradiated with ultraviolet radiation and, once the ultraviolet tape 1303 has lost its adhesiveness, the fourth external connection 1221 may be physically separated from the ring structure 1301.

Once debonded, a singulation of the structure to form the InFO-POP structure 1500 is performed. In an embodiment the singulation may be performed by using a saw blade (not shown) to slice through the encapsulant 1101 and the polymer layer 805 between the vias 811, thereby separating one section from another to form the InFO-POP structure 1500 with the first semiconductor device 901. However, as one of ordinary skill in the art will recognize, utilizing a saw blade to singulate the InFO-POP structure 1500 is merely one illustrative embodiment and is not intended to be limiting. Alternative methods for singulating the InFO-POP structure 1500, such as utilizing one or more etches to separate the InFO-POP structure 1500, may alternatively be utilized. These methods and any other suitable methods may alternatively be utilized to singulate the InFO-POP structure 1500.

Figure 16:
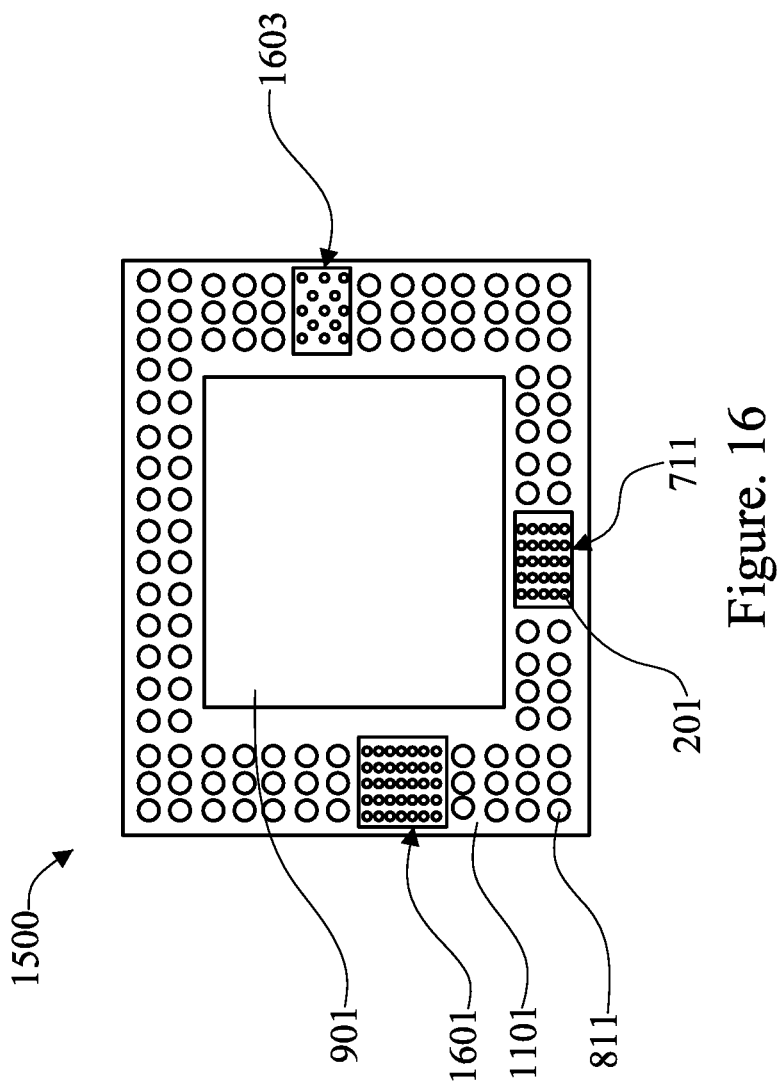
FIG. 16 illustrates a cross-section of an InFO-POP structure in accordance with some embodiments.

FIG. 16 illustrates an example cross-section of the InFO-POP structure 1500 through A-A' as shown in FIG. 15. As FIG. 16 illustrates, the first semiconductor device 901 is surrounded by the vias 811, the first interconnect structure 711, a third interconnect structure 1601, and a fourth interconnect structure 1603. FIG. 16 illustrates the InFO-POP structure 1500 including three interconnect structures, though in other embodiments the InFO-POP structure 1500 includes another number of interconnect structures (e.g., one interconnect structure, two interconnect structures, five interconnect structures, or another number of interconnect structures). In an embodiment the third interconnect structure 1601 and the fourth interconnect structure 1603 may be similar to the first interconnect structure 711, and may be formed and incorporated into the InFO-POP structure 1500 utilizing similar processes. However, the third interconnect structure 1601 and the fourth interconnect structure 1603 may also be different from the first interconnect structure 711. For example, the first interconnect structure 711, the third interconnect structure 1601, and the fourth interconnect structure 1603 may have different sizes, different shapes, different arrangement, number, or types of IPDs, different arrangement or numbers of the TSVs 201, or be different in other aspects. In an embodiment, the first interconnect structure 711, the third interconnect structure 1601, and the fourth interconnect structure 1603 are located adjacent to the vias 811 between the first semiconductor device 901 and the edge of the InFO-POP structure 1500. In an embodiment, the vias 811 form a "ring" of vias 811 surrounding the first semiconductor device 901, and the first interconnect structure 711, the third interconnect structure 1601, and the fourth interconnect structure 1603 may be disposed in the "ring." In an embodiment, the first interconnect structure 711, the third interconnect structure 1601, and the fourth interconnect structure 1603 can be used in place of the vias 811 in the InFO-POP structure 1500. As FIG. 16 illustrates, in an embodiment the TSVs 201 of the first interconnect structure 711, the third interconnect structure 1601, and the fourth interconnect structure 1603 may have a smaller width and/or have a greater density than the vias 811 of the InFO-POP structure 1500.

The interconnect structure disclosed herein may be an embedded dual side IPD (eDS-IPD). By incorporating integrated passive devices (IPDs) and through substrate vias (TSVs) in the same structure, the interconnect structure (e.g., the eDS-IPD) can serve both as an IPD device and an interconnect path between a semiconductor device (e.g., the first semiconductor device 901) and a package (e.g., the first package 1400). For example, the interconnect structure may serve as an IPD and an interconnect path between a semiconductor device and a DRAM, simultaneously. The interconnect structure (e.g., the first interconnect structure 711) can replace vias (e.g., the vias 811) in an InFO-PoP structure (e.g., the InFO-PoP structure 1500) to enhance routing flexibility and save penalty area. For example, positioning the interconnect structure with the vias can reduce area for the IPDs and the semiconductor device placed side-by-side.

The interconnect structure can also provide better capacitance performance due to smaller path inductance.

In an embodiment, a semiconductor device includes a redistribution layer (RDL) and a die disposed on the RDL. The semiconductor device also includes a first set of through vias between and connecting a top substrate and the RDL, the first set of through vias in physical contact with a molding compound and separated from the die by the molding compound. The semiconductor device also includes a first interconnect structure between and connecting the top substrate and the RDL, the first interconnect structure separated from the die and from the first set of through vias by the molding compound. The first interconnect structure includes at least one passive device and a second set of through vias within the first interconnect structure.

In another embodiment, a semiconductor device includes a layer between a package and a redistribution layer (RDL). The layer includes a semiconductor die connected to the RDL. A first side of the semiconductor die is connected to the RDL and a second side of the semiconductor die is attached to a polymer layer by an adhesive layer. The layer also includes at least one first via extending from a first side of the layer to a second side of the layer, a first passive device structure, and a second passive device structure. The first passive device structure includes at least one passive device and at least one second via disposed within the first passive device structure. The second passive device structure includes at least one passive device and at least one third via disposed within the second passive device structure The semiconductor device also includes a molding compound surrounding the semiconductor die, the at least one first via, the first passive device structure, and the second passive device structure, wherein the first passive device structure is separated from the at least one first via and the second passive device structure by the molding compound and wherein the at least one first via extends from a first side of the molding compound to a second side of the molding compound. The at least one first via, the at least one second via, and the at least one third via connect the RDL and the package, wherein the at least one second via and the at least one third via are through substrate vias (TSVs).

In yet another embodiment, a method of manufacturing a semiconductor device is provided. The method includes forming a set of vias on a redistribution layer (RDL), placing a die on the RDL separated from the set of vias, and placing a first interconnect structure on the RDL. The first interconnect structure is separated from the die and the vias, and the first interconnect structure includes a substrate, at least one through conductive element extending from one side of the substrate to a second side of the substrate, and at least one integrated passive device. The method also includes encapsulating the set of vias, the die, and the first interconnect structure in an encapsulant, wherein the encapsulant is in physical contact with the set of vias, the die, and the first interconnect structure, and planarizing the set of vias, the die, and the first interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a redistribution layer (RDL);
    a die disposed on the RDL;
    a first set of through vias between and connecting a top substrate and the RDL, the first set of through vias in physical contact with a molding compound and separated from the die by the molding compound; and
    a first interconnect structure between and connecting the top substrate and the RDL, the first interconnect structure separated from the die and from the first set of through vias by the molding compound, the first interconnect structure comprising:
        at least one passive device; and
        a second set of through vias within the first interconnect structure.

2. The semiconductor device of claim 1, wherein the at least one passive device is a trench capacitor.

3. The semiconductor device of claim 1, wherein the passive device comprises a conductive pillar over the second set of through vias.

4. The semiconductor device of claim 3, wherein the conductive pillar is in physical contact with the molding compound.

5. The semiconductor device of claim 1, wherein the first interconnect structure further comprises a metallization layer, and wherein the at least one passive device is connected to the die through the metallization layer.

6. The semiconductor device of claim 1, further comprising a second interconnect structure between and connecting the top substrate and the RDL, the second interconnect structure separated from the die, from the first interconnect structure, and from the first set of through vias by the molding compound.

7. The semiconductor device of claim 1, wherein the first set of through vias surrounds the die and the first interconnect structure is disposed within the first set of through vias.

8. The semiconductor device of claim 1, further comprising a top package disposed over the die and the first interconnect structure.

9. A semiconductor device comprising:
    a layer between a package and a redistribution layer (RDL), the layer comprising:
        a semiconductor die, wherein a first side of the semiconductor die is connected to the RDL and a second side of the semiconductor die is attached to a polymer layer;
        at least one first via extending from a first side of the layer to a second side of the layer;
        a first passive device structure, the first passive device structure comprising:
            at least one passive device; and
            at least one second via disposed within the first passive device structure
        a second passive device structure, the second passive device structure comprising:
            at least one passive device; and
            at least one third via disposed within the second passive device structure;
        a molding compound surrounding the semiconductor die, the at least one first via, the first passive device structure, and the second passive device structure, wherein the first passive device structure is separated from the at least one first via and the second passive device structure by the molding compound, wherein the at least one first via extends from a first side of the molding compound to a second side of the molding compound; and wherein the at least one first via, the at least one second via, and the at least one third via connect the RDL and the package, wherein the at least one second via and the at least one third via are through substrate vias (TSVs).

10. The semiconductor device of claim 9, further comprising a third passive device structure.

11. The semiconductor device of claim 9, wherein the at least one second via has an aspect ratio from about 3:1 to about 10:1.

12. The semiconductor device of claim 9, wherein the at least one first via has a larger width than the at least one second via.

13. The semiconductor device of claim 9, wherein the at least one second via is connected to the package through a redistribution layer.

14. The semiconductor device of claim 9, wherein the at least one second via is connected to the RDL through a metallization layer.

15. The semiconductor device of claim 9, wherein the semiconductor die is connected to the at least one passive device of the first passive device structure through the RDL.

16. A semiconductor device comprising:
a set of vias disposed on and connected to a redistribution layer (RDL);
a die disposed on and connected to the RDL, wherein the die is separated from the set of vias by an encapsulant; and
a first interconnect structure disposed on and connected to the RDL, wherein the first interconnect structure is separated from the die and the set of vias by the encapsulant, wherein the encapsulant is in physical contact with the set of vias, the die, and the first interconnect structure, wherein respective top surfaces of the set of vias, the die, the encapsulant, and the first interconnect structure are level, and wherein the first interconnect structure comprises:
a substrate;
at least one through conductive element extending from one side of the substrate to a second side of the substrate; and
at least one integrated passive device.

17. The semiconductor device of claim 16, wherein the die is connected to the at least one integrated passive device of the first interconnect device structure through the RDL.

18. The semiconductor device of claim 16, further comprising a top package disposed over the set of vias, the die, and the first interconnect structure, wherein the top package is connected to the set of vias and the first interconnect structure.

19. The semiconductor device of claim 16, further comprising a second interconnect structure disposed on and connected to the RDL.

20. The semiconductor device of claim 16, wherein the at least one integrated passive device is a trench capacitor.

* * * * *